United States Patent
Kazandjian et al.

(10) Patent No.: US 7,067,008 B2
(45) Date of Patent: Jun. 27, 2006

(54) PROCESS FOR THE PRODUCTION OF CD XTE SEMICONDUCTOR CRYSTALS WITH HIGH RESISTIVITY AND RESULTING CRYSTALLINE MATERIAL

(75) Inventors: Anne Kazandjian, Chennevieres sur Marne (FR); Jean-Marie Koebel, Nordheim (FR); Paul Siffert, Mittelhausbergen (FR)

(73) Assignee: Eurorad 2-6 SA, Strasbourg Cedex (FR)

( * ) Notice: Subject to any disclaimer, the term of this patent is extended or adjusted under 35 U.S.C. 154(b) by 230 days.

(21) Appl. No.: 10/378,896

(22) Filed: Mar. 5, 2003

(65) Prior Publication Data

US 2003/0209184 A1 Nov. 13, 2003

(30) Foreign Application Priority Data

Mar. 5, 2002 (FR) .......................................... 02 02784

(51) Int. Cl.
*C30B 15/04* (2006.01)
*C30B 11/00* (2006.01)

(52) U.S. Cl. ........................................... 117/19; 117/81
(58) Field of Classification Search ................... 117/13, 117/17, 81, 82, 19
See application file for complete search history.

(56) References Cited

U.S. PATENT DOCUMENTS

| 4,642,799 A | * | 2/1987 | Glass | .......................... 365/114 |
| 2003/0209184 A1 | * | 11/2003 | Kazandjian et al. | ............ 117/2 |
| 2004/0155255 A1 | * | 8/2004 | Yamamoto et al. | .......... 257/102 |

FOREIGN PATENT DOCUMENTS

| EP | 0 261 647 A2 | 3/1988 |
| FR | 2 314 759 | 1/1977 |
| FR | 2 703 696 | 10/1994 |
| JP | 03005399 | 1/1991 |

OTHER PUBLICATIONS

STN search of Apr. 26, 2005.*
Lima et al., Structural Characterization of Epitaxial CdZnTe Semiconductor Thin Films by Ion Beam Techniques, Journal of Crystal Growth 253, (2003) pp. 89–94.*
P. Wurm et al., "Study of the Photodecay in CdTe X–ray Detectors," Materials Science and Engineering B, V. 28, 1994, pp. 47–50.
M. Schieber et al., "Comparison of Cadmium Zinc Telluride Crystals Grown by Horizontal and Vertical Bridgman and from the Vapor Phase," Journal of Crystal Growth, V. 231, 2001, pp. 235–241.
A. Aoudia et al., "Crystal Growth and Characterization of CdTe Doped with Transition Metal Elements," Optical Materials, V. 4, 1995, pp. 241–245.
Jack F. Butler et al., "Gamma– and X–ray Detectors Manufactured from $Cd_{1-x}Zn_xTe$ Grown by a High Pressure Bridgeman Method," Materials Science & Engineering B, V. B16, 1993, pp. 291–295.

* cited by examiner

*Primary Examiner*—Benjamin L. Utech
*Assistant Examiner*—Matthew Anderson
(74) *Attorney, Agent, or Firm*—Young & Thompson

(57) ABSTRACT

Process for the production of semiconductor crystals with high resistivity of the CdXTe type, wherein X=Zn, Se, ZnSe or 0, characterized in that it consists in carrying out a multiple doping with iron and with at least one second doping element selected from the group formed by the elements of group III of the periodic chart of the elements.

15 Claims, No Drawings

PROCESS FOR THE PRODUCTION OF CD XTE SEMICONDUCTOR CRYSTALS WITH HIGH RESISTIVITY AND RESULTING CRYSTALLINE MATERIAL

BACKGROUND OF THE INVENTION

The present invention relates to the field of crystalline semiconductor materials and their processes for production, particularly crystals of CdTe, CdZnTe, CdSeTe or CdZnSeTe having a high resistivity, and has for its object a process for the production of such crystals, a corresponding crystalline material as well as various applications of such a material.

In numerous applications, it is necessary to have crystals of CdTe, CdZnTe, CdSeTe or CdZnSeTe having a high resistivity, which is to say typically at least equal to and preferably greater than $10^9$ ohms cm.

It has been known for several decades that cadmium telluride cannot be obtained in a semi-insulating form (resistivity >$10^9$ ohms) without chemical composition, and this no matter what the process of growth, because of the presence of lacunae of electrically active cadmium, which must be compensated. This has been demonstrated, both by modeling and by experimental results.

According to the present state of the art, this high resistivity is obtained by doping with a single doping element, introduced in the course of the process of production. We thus speak of a "compensation process".

Among the doping elements, chlorine, in the form of cadmium chloride, is most generally used, but indium or aluminum are also used.

Among the processes for production, the growth by the so-called methods of "transfer from a solvent zone" (such as those known by the terms "traveling solvent method" or "traveling heater method" or "traveling gradient zone melting") is historically the most used, but growth by so-called "Bridgman" methods (Bridgman high pressure or BHP, Bridgman low pressure, Bridgman in sealed ampoule etc.) are more and more often advocated, all these methods forming a part of the methods called crystallization in liquid phase.

The methods of growth by crystallization in gaseous phase can also use the same process for compensation by doping with a doping element.

The mentioned processes for production, associated with compensation mechanisms, are well known to those skilled in the art and have for example been described in the following documents: FR-A-2 172 231; FR-A-2 228 540; FR-A-2 314 759; "Deep centers for optical processing in CdTe", E. Rzepha et al., Materials Science and Engineering, B16(1993), 262-267, Elsevier Sequoia; "Deep levels in smi-insulating CdTe", P. Moravec et al., Materials Science and Engineering, B16 (1993), 223–227, Elsevier Sequoia.

Similarly, devices for their practice have also been known (see for example FR-A-2 332 799).

However, the electrical quality (particularly the degree of resistivity) of the crystals obtained by these known processes, is extremely subject to the skill and experience of the operators.

In fact, the residual impurities inevitably present in the material, play a substantial role, evidently by interaction with the dopant voluntarily added and/or with the lacunae of cadmium (and/or zinc) systematically present in the crystal.

SUMMARY OF THE INVENTION

The problem addressed by the present invention accordingly consists principally in providing a process for the preparation or production permitting better control of the electrical properties of the crystalline materials to be produced, guaranteeing in particular, in a reproducible manner, obtaining crystals of high resistivity also having substantial diffusion lengths, at least for electrons.

Moreover, another object of the invention is to permit achieving the mentioned results no matter what the method of production.

Finally, still another object of the invention is to provide different improvements in the techniques of growth by crystallation in liquid phase mentioned above.

To this end, the invention has for its principal object a process for the production of semiconductor crystals with high resistivity of the type Cd XTe, wherein X=Zn, Se, ZnSe or zero (nothing), characterized in that it consists in carrying out a multiple doping with Fe and with at least a second doping element selected from the group consisting of the elements in Group III of the periodical classification of the elements.

The inventors have thus discovered, in a surprising and unforeseeable manner, that the use of the two types of doping elements mentioned above, in the scope of a multiple doping by means of two types of different doping elements (double doping or co-doping) or at least three types of different doping elements (iron and at least two others of the mentioned elements), carried out at the moment of crystalline formation, permits achieving the first object mentioned above, which is to say the semi-insulating character of the crystal with important diffusion lengths.

Thus, the specific multiple doping according to the invention, to the extent to which it is controlled, permits a reliable control of the process of compensation and a greater flexibility in the parameters of the doping mechanism.

Preferably, the second doping element, or one of the doping elements associated with iron, is Al or Ga.

According to a characteristic of the invention, the doping elements are integrated or introduced into the charge, from which is formed the crystalline material (for example by drawing, condensation or growth), with concentrations relative to said charge comprised, for each of said dopants, between one part per billion by weight or atomic in ten parts by million weight or atomic.

The inventors have moreover found that in the case of a co-doping (Fe+another doping element), the results, in terms of reproducibility and of such insulating properties as the transfer of the obtained crystalline material, were optimum when the mutual ratio of the contents of iron and of the second dopant, expressed in atomic fractions, is comprised between 2.5:1 and 1.5:1, and is preferably about 2:1.

So as to improve the quality of the crystalline boules obtained by the process according to the invention, particularly by passivation of the defects of the structure of the boule, it can be preferably provided that the growth of the crystals and/or their possible subsequent annealing, be carried out in the presence of a gas selected from the group consisting of hydrogen, nitrogen and mixtures of these latter.

The arrangements and measures according to the invention mentioned above, can be used, as those skilled in the art will understand, also in the case of methods of so-called production by condensation in gaseous phase, as well as in methods of so-called crystallization in liquid phase.

In this latter case, the growth can be preferably carried out according to a crystalline growth method selected from the group consisting of the methods called "transfer from a solvent zone", or the methods called "Bridgman" and more particularly the method called "Bridgman under high pressure", or the method called "Bridgman in a tube or sealed ampoule", the initial charge having at least a slight excess of Te.

According to the invention, the charge, comprised by a mixture, preferably proportional of Cd, Te and if desired Zn and/or Se, is disposed in a crucible and the doping elements are included, with weight concentrations and a predetermined mutual weight ratio, into the mixture of Cd, Te and, if desired Zn and/or Se forming the initial charge, the crucible receiving said doped charge.

Preferably, the crucible consists, entirely or at least in the form of a layer of internal coating, of a material selected from the group consisting of quartz, pyrolytic carbon, vitreous graphite and boron nitride.

The inventors have also been able to demonstrate that, in the scope of a practice of the so-called Bridgman method under high pressure, the drawing can take place under a pressure of at most 50 bars of neutral gas and/or a mixture of neutral gases, preferably under a pressure of neutral gas comprised between 10 and 30 bars, preferably about 15 bars, this being contrary to the teaching of the art which recommends pressures of the order of 100 bars.

Moreover, in the scope of practice of the method called Bridgman in a sealed ampoule, the charge is placed in a quartz ampoule, sealed and under vacuum or under a low pressure, as the case may be partial, of neutral gas.

DETAILED DESCRIPTION OF THE PREFERRED EMBODIMENTS

There will now be described by way of non-limiting example, a practical use of the invention based more particularly on the so-called BHP (Bridgman high pressure method).

This method permits growing crystals of CdTe and of $Cd_{1-x}Zn_xTe$ with particular electrical properties, favorable to their use for the production of nuclear radiation detectors. The growth takes place conventionally under high pressures, of the order of 100 atm, of neutral gas or of controlled atmosphere.

The values of the pressures used at present in this process thus require great constraints on the design and use of the growth equipment. The ovens must be, in the pressurized regions, capable, for reasons of safety, to resist at least twice the operating pressure. The regulations in force as to pressure apparatus are extremely precise and require periodic controls, such as testing under water pressure, which are difficult to square with the nature of the products produced and the delicacy of the procedure. It is thus a costly apparatus, heavy to use and inflexible.

According to the literature, the charge is contained in an open graphite crucible, generally vertical. The graphite available in the market (if it is not of electrical purity), inevitably contains a certain number of impurities, adapted to interfere with the quality of the crystals obtained. The nature of the graphite used, its origin, its treatments to which it has been subjected during its shaping, are thus parameters which substantially influence the properties of the obtained crystals. The reproducibility of the process is thus not guaranteed from one growth to the next. This constitutes a major drawback if it is sought to industrialize the method to use production tools on a large scale. Moreover, the graphite, because of its coefficients of thermal expansion, exerts important forces on the crystal in the course of cooling, which also generate important structural defects within the crystal. These mechanical properties render, as a general rule, the unmolding of the final boule difficult.

In the BHP method, the presence of a pressure of neutral gas is made necessary by the use of an open crucible, in contact with the empty volume of the furnace. The high value of the partial pressures of the components gives rise to a considerable loss of charge in the absence of such a counterpressure.

However, the inventors have discovered that the values of the counterpressure (which cannot modify the value of the partial pressures of the chemical species present and which is only adapted to slow the speed of evaporation of the charge), employed and described at present seem excessively high to fulfill this simple role of slowing evaporation.

Growths have been achieved by the inventors under predetermined conditions permitting obtaining crystals with interesting characteristics. Values comprised between 6 and 100 bars of neutral gas have been used. These experiments have shown that, practically, the loss becomes small and does not increase in a significant way when the pressure exceeds 15 bars. The crystals in all cases have the desired qualities for nuclear detection.

It is thus possible to obtain crystals of CdTe and $Cd_{1-x}Zn_xTe$ usable for nuclear detection, under the conditions indicated in the scientific literature, but at pressures of the order of 15 atm of neutral gas only.

For example, crystals of CdTe and $Cd_{1-x}Zn_xTe$ with a resistivity greater than $10^9$ $\Omega$ centimeters have been obtained in an industrial graphite crucible, with a BHP configuration with a working pressure of 30 bars of argon of high purity. Their electrical properties have permitted making nuclear radiation detectors.

Another modification can consist in decreasing the volume of expansion of the gases above the charge. The charge, contained in a graphite crucible of the same type as that used in the BHP configuration described above, must be placed within a sealed quartz ampoule as near as possible the charge. The composition of the charge should take account of the stoechiometric conditions existing at the time of starting crystallization in the conventional BHP configuration. This charge will thus be in excess of Te (Xte-0.56 to 0.60). For growth, properly so called, it will suffice to use a furnace of the conventional "Bridgman" type. The thermal cycle should take account of the exhaustion of the solution of Te, which is to say that the temperature should be lowered as a function of the drawn length.

Moreover, to avoid the low reproducibility of the process resulting from doping with residual impurities of the industrial graphite forming the crucible, the inventors have shown that it is possible to obtain crystals comparable to those obtained by the conventional BHP method, in a graphite crucible, by replacing this latter with a quartz crucible and conjointly by adding Fe and Al in atomic concentrations of the order of ppm or ppb in a precise ratio. It has also been shown that the optimization of the properties obtained depends also on the ratio of the concentrations of these two impurities (Fe and Al).

Thus, the risks due to graphite present are avoided and the process can be reproduced as desired.

On the other hand, the mechanical properties of the quartz permit avoiding compression of the boule in the crucible, the density of the dislocations decreases and the risk of destruction upon demolding is considerably reduced.

By way of example, the following operative protocol, carried out with a BHP furnace, permits obtaining the desired results:

1. The starting elements, Cd, Te and Zn must be carefully weighed and distributed in the desired proportions. It is preferable that the mixture be enriched with Te at the outset, the experimental conditions of the BHP furnaces leading naturally to enrichment in Te.

2. The dopants Fe (2 ppm for example) and Al (1 ppm for example) are weighed as a function of the quantity of CdTe or $Cd_{1-x}Zn_xTe$ desired and are incorporated hot with a small proportion of the Te of the charge (20 g for example). The obtained alloy (Te+Fe+Al) is then added to the charge.

3. The mixture is placed in a quartz crucible that has previously been pickled and is covered internally as desired with a layer of pyrolytic carbon (for example), or is internally lined with a counter crucible of vitreous graphite of the type known by the name "Glassycarbon", or boron nitride, or silica or porous graphite.

4. The assembly is introduced into a BHP furnace and a cycle of traditional drawing, corresponding to a loss of solution can be applied.

The protocol described above can be practiced or modified as to the following points:

the quartz crucible can be replaced by any other chemically stable crucible compatible with the elements present. The crucible should not moreover be likely to release or capture undesired dopants (impurities) or to capture the dopants intentionally introduced into the charge. The material used should moreover have suitable coefficients of expansion and not exert excessive forces on the boule. Among the materials usable can be mentioned vitreous graphite and boron nitride.

Given the electronic properties of Fe and Al, there is no reason not to replace this latter (Al) or to complement the pair of dopants by any other element from group III (B, Ga, In, Tl . . . ) of the periodic charge of the elements. Gallium, for reasons of electronic configuration, is a particularly interesting candidate for substitution or addition.

the charge can be encapsulated in a quartz ampoule sealed under vacuum or under a low pressure of gas, neutral or of controlled composition. The drawing is then carried out according to the "Bridgman vertical" technique, taking account of the loss of the solution and the resulting change in the temperature of crystallization.

Moreover, the possibility of applying a gas pressure above the charge can be used to add supplemental dopants that are difficult to incorporate otherwise than in the gaseous phase. Hydrogen and nitrogen for example form a part of these dopants.

Thus, hydrogen is known for a long time in the semiconductor industry as an important element, it has the particularity of passivating the defects present in the materials or at their surfaces.

The inventors have been able to verify that the application of a mixture comprised by argon and hydrogen substantially improves the qualities of the boules of $Cd_{1-x}Zn_xTe$ or of CdTe obtained. Hydrogen thus present at all stages of the growth permits, among other things, passivating the defects of the structure of the boule. The gas employed permits maintaining the high resistivity of the material whilst significantly improving the properties of transport of the crystals. The characteristics of the boules are thus much more stable and reproducible.

The process according to the invention can thus preferably be completed by the use of a pressure of hydrogen or one of its mixtures. This is applicable as well to the BHP configuration as to the "Bridgman" configuration (particularly a sealed quartz ampoule). In this latter case, the pressure will be much less and lower than atmospheric pressure.

The use of hydrogen or of its mixtures in the sealed quartz ampoules is, generally speaking, an improvement on the conventional methods of growth of CdTe and of $Cd_{1-x}Zn_xTe$ such as the THM and "Bridgman" methods in all their forms.

Nitrogen is a doping element for CdTe and $Cd_{1-x}Zn_xTe$. It is an effective donor if it is incorporated in a suitable manner. The neutral gas or hydrogen are replaceable by nitrogen or one of its mixtures, and it is thus possible to incorporate it in massive boules to adjust their electrical properties.

Finally, under certain circumstances, it is interesting to anneal the boules or the plates after growth by following precise thermal cycles. In this case, generally speaking, the use of a hydrogenated case seems to be very beneficial.

As already indicated above, the process according to the invention can, in its two modified embodiments, also use the monocrystalline growth method called "Bridgman" which is used since the beginning of research on semiconductors to draw the most perfect monocrystals possible.

It is particularly used with success in the growth of CdTe and of $Cd_{1-x}Zn_xTe$ to obtain large monocrystals permitting the production of substrates for the industry of infrared detectors.

This method, if it permits controlling in a very satisfactory manner the structural properties of the boules, has nevertheless never been, until now, useful for the growth of materials adapted for the production of nuclear radiation detectors.

However, it has the double advantage of being more rapid than the THM method and of requiring much more simple equipment than the BHP method.

However, thanks to the arrangements of the invention, and particular because of multiple doping, the inventors have been able to obtain crystals with very high resistivity, on the one hand, by using a graphite crucible supplying the dominant doping impurities Fe and Al, and, on the other hand, by using no graphite crucible, the charge doped with Fe and Al being then directly emplaced in a sealed quartz ampoule used in this method.

During use of a graphite crucible, those produced from graphite of the type ATJW (ATJ49B) of the Union Carbide company have enabled obtaining good results, without the latter being nevertheless perfectly reproducible.

The present invention also has for its object a crystalline semiconductor material with high resistivity, of the formula $Cd_{1-x}X_xTe$, wherein 0 is $\leq x<1$ and X=Zn and/or Se, characterized in that it integrates at least two doping elements, namely, on the one hand, Fe, and on the other hand, at least one element from group III of the periodical chart of the elements.

Although said material can, as described in relation to the process above, include three or more doping elements, it will preferably include only two doping elements, the second being selected from the group consisting of Al, Ga, B, In and Tl.

Preferably, the doping elements are present in atomic contents comprised between 1 ppb and 10 ppm relative to the total mass of the material and the ratio of the respective atomic contents of Fe and of the second doping element is comprised between 2.5:1 and 1.5:1, and is preferably of the order of about 2:1.

The crystalline material mentioned above could of course be suitably obtained by the process described above.

Finally, the invention also relates to a radiation detector, particularly nuclear, which can operate at ambient temperature, characterized in that it comprises as the material sensitive to radiation, a crystalline material of the type described above, as well as an electro-optical device, characterized in that it comprises as active element a portion of crystalline material of this type.

Of course, the invention is not limited to the described embodiment. Modifications remain possible, particularly as to the construction of the various elements or by substitution of technical equivalents, without thereby departing from the scope of protection of the invention.

What is claimed is:

1. Process for the production of semiconductor crystals with resistivity of the Cd XTe type, wherein X=Zn, Se, ZnSe or 0, comprising the step of:
   providing a multiple doping with iron and with at least one second doping element selected from the group consisting of elements of group III of the periodic chart of the elements,
   wherein the second doping element is Al.

2. Process for production according to claim 1, characterized in that the doping elements are at least of three different types.

3. Process according to claim 1, characterized in that the multiple doping consists in a double doping or co-doping with iron and a second doping element.

4. Process for production according to claim 1, characterized in that the doping elements are integrated or introduced into the charge, from which is formed the crystalline material, with concentrations relative to said charge comprised, for each of said dopants, between one part per billion by weight and ten parts per million by weight.

5. Process for production according to claim 1, wherein the mutual ratio of the contents of iron and of the second dopant, expressed in atomic fractions, is comprised between 2.5:1 and 1.5:1.

6. Process for production according to claim 5, wherein the ratio is about 2:1.

7. Process for production according to claim 1, characterized in that the growth of the crystals and/or their possible subsequent annealing is carried under the presence of a gas selected from the group consisting of hydrogen, nitrogen and mixtures of these latter.

8. Process for production according to claim 1, characterized in that the growth or the drawing is carried out according to a crystalline growth method selected from the group consisting of the methods called "Transfer from a solvent zone", "Bridgman" and "Bridgman under high pressure", the initial charge having at least a slight excess of Te.

9. Process for production according to claim 8, characterized in that, in the scope of the use of the Bridginan high pressure method, the growth takes place under a pressure of at most 50 bars of neutral gas or a mixture of neutral gases, preferably under a pressure of neutral gas comprised between 10 and 30 bars, preferably about 15 bars.

10. Process for production according to claim 8, characterized in that, in the scope of the practice of the Bridgman method, the charge is placed in a sealed quartz ampoule under vacuum or under a low pressure, as the case may be partial, of neutral gas.

11. Process for production according to claim 8, characterized in that the doping elements are incorporated, with atomic concentrations and with a mutual predetermined ratio, into the mixture of Cd, Te and, possibly Zn and/or Se forming the initial charge, the crucible receiving said doped charge.

12. Process for production according to claim 8, characterized in that the crucible consists, entirely or at least as an internal cladding layer, of a material selected from the group consisting of quartz, pyrolytic carbon, vitreous graphite and boron nitride.

13. Process for production according to claim 1, wherein the doping elements are present in amounts comprised between 1 ppb and 10 ppm by weight relative to the total weight of the material.

14. Process for production according to claim 1, wherein the ratio of the respective atomic contents of iron and of the second doping element is between 2.5:1 and 1.5:1.

15. Process for production according to claim 14, wherein the ratio is about 2:1.

* * * * *

UNITED STATES PATENT AND TRADEMARK OFFICE
CERTIFICATE OF CORRECTION

PATENT NO. : 7,067,008 B2  Page 1 of 1
APPLICATION NO. : 10/378896
DATED : June 27, 2006
INVENTOR(S) : Anne Kazandjian et al.

It is certified that error appears in the above-identified patent and that said Letters Patent is hereby corrected as shown below:

On the title page, amend Item (75) to read as follows:

--(75) Inventors: Anne Kazandjian, Chennevieres sur Marne (FR); Jean-Marie Koebel, Nordheim (FR); Paul Siffert, Mittelhausbergen (FR); Makram Hage Ali, Eckbolsheim (FR)--.

Signed and Sealed this

Tenth Day of July, 2007

JON W. DUDAS
*Director of the United States Patent and Trademark Office*